(12) United States Patent
Geng et al.

(10) Patent No.: US 8,076,960 B2
(45) Date of Patent: Dec. 13, 2011

(54) DIGITAL PHASE-LOCKED LOOP WITH TWO-POINT MODULATION USING AN ACCUMULATOR AND A PHASE-TO-DIGITAL CONVERTER

(75) Inventors: Jifeng Geng, San Diego, CA (US); Gary J. Ballantyne, Christchurch (NZ); Daniel F. Filipovic, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 97 days.

(21) Appl. No.: 12/432,468

(22) Filed: Apr. 29, 2009

(65) Prior Publication Data

US 2010/0277211 A1 Nov. 4, 2010

(51) Int. Cl.
*H03L 7/06* (2006.01)
(52) U.S. Cl. .................................. 327/156; 327/147
(58) Field of Classification Search .............. 327/149, 327/158, 147, 156
See application file for complete search history.

(56) References Cited

U.S. PATENT DOCUMENTS

| | | | | |
|---|---|---|---|---|
| 6,700,447 B1* | 3/2004 | Nilsson | | 331/10 |
| 6,809,598 B1* | 10/2004 | Staszewski et al. | | 331/16 |
| 7,053,727 B2* | 5/2006 | Nilsson | | 332/127 |
| 7,403,750 B2* | 7/2008 | Rosnell et al. | | 455/127.4 |
| 7,443,206 B1 | 10/2008 | Fernandez | | |
| 7,443,261 B2* | 10/2008 | Yoshikawa et al. | | 332/144 |
| 7,535,311 B2* | 5/2009 | Nergis | | 332/127 |
| 2004/0192231 A1* | 9/2004 | Grewing et al. | | 455/102 |
| 2004/0192369 A1* | 9/2004 | Nilsson | | 455/522 |
| 2004/0196924 A1* | 10/2004 | Wilson | | 375/302 |
| 2005/0286562 A1* | 12/2005 | Nakao et al. | | 370/477 |
| 2006/0171495 A1 | 8/2006 | Youssouflan | | |
| 2007/0165743 A1* | 7/2007 | McCallister | | 375/296 |
| 2007/0205831 A1* | 9/2007 | Yoshikawa et al. | | 331/16 |
| 2008/0129406 A1* | 6/2008 | Nergis | | 332/127 |
| 2008/0205571 A1* | 8/2008 | Muhammad et al. | | 375/376 |
| 2009/0102564 A1* | 4/2009 | Ballantyne | | 331/10 |
| 2009/0322439 A1* | 12/2009 | Mayer et al. | | 332/118 |

(Continued)

FOREIGN PATENT DOCUMENTS

WO WO2008005853 1/2008

OTHER PUBLICATIONS

International Search Report and Written Opinion—PCT/US2010/033044, International Search Authority—European Patent Office—Oct. 5, 2010.
Partial International Search Report, PCT/US2010/033044—International Search Authority—European Patent Office, Jul. 19, 2010.

(Continued)

*Primary Examiner* — Lincoln Donovan
*Assistant Examiner* — Adam D Houston
(74) *Attorney, Agent, or Firm* — Jiayu Xu

(57) ABSTRACT

A digital phase-locked loop (DPLL) supporting two-point modulation is described. In one design, the DPLL includes a phase-to-digital converter and a loop filter operating in a loop, a first processing unit for a lowpass modulation path, and a second processing unit for a highpass modulation path. The first processing unit receives an input modulating signal and provides a first modulating signal to a first point inside the loop after the phase-to-digital converter and prior to the loop filter. The second processing unit receives the input modulating signal and provides a second modulating signal to a second point inside the loop after the loop filter. The first processing unit may include an accumulator that accumulates the input modulating signal to convert frequency to phase. The second processing unit may include a scaling unit that scales the input modulating signal with a variable gain.

27 Claims, 7 Drawing Sheets

U.S. PATENT DOCUMENTS

2010/0066421 A1* 3/2010 Geng et al. .................. 327/159

OTHER PUBLICATIONS

Volodymyr Kratyuk et al: "A Design Procedure for All—Digital Phase-Locked Loops Based on a Charge-Pump Phase-Locked-Loop Analogy "IEEE Transactions on Circuits and Systems 11: Express Briefs, IEEE Service Center, New York, NY, US LNKDD01:10.1109/TCSII.2006.889443, vol. 54, No. 3, Mar. 1, 2007, pp. 247-251, XP011175096 ISSN: 1057-7130.

* cited by examiner

DIGITAL PHASE-LOCKED LOOP WITH TWO-POINT MODULATION USING AN ACCUMULATOR AND A PHASE-TO-DIGITAL CONVERTER

BACKGROUND

I. Field

The present disclosure relates generally to electronics, and more specifically to a digital phase-locked loop (DPLL) with two-point modulation.

II. Background

A DPLL is a circuit commonly used to adjust the frequency and/or phase of an oscillator. In one common application, a DPLL may be used to lock the frequency and/or phase of an oscillator to a reference signal having a precise frequency.

In another application, a DPLL may be used to modulate the frequency and/or phase of an oscillator with a modulating signal. If the bandwidth of the modulating signal is much smaller than a closed-loop bandwidth of the DPLL, then the modulating signal may be applied prior to a loop filter within the DPLL. However, if the bandwidth of the modulating signal is wider than the closed-loop bandwidth, then two-point modulation may be performed. For two-point modulation, the modulating signal may be applied to two modulation paths in the DPLL—one modulation path for narrowband modulation and another modulation path for wideband modulation. Two-point modulation may be used to effectively increase the bandwidth of the DPLL, so that the oscillator can be frequency modulated with a wideband modulating signal while minimally disturbing the normal operation of the DPLL.

SUMMARY

A DPLL supporting two-point modulation is described herein. In one design, the DPLL includes a phase-to-digital converter (PDC) and a loop filter operating in a loop, a first processing unit for a lowpass modulation path, and a second processing unit for a highpass modulation path. The lowpass modulation path supports narrowband modulation of the frequency and/or phase of an oscillator. The highpass modulation path supports wideband modulation of the frequency and/or phase of the oscillator. The first processing unit receives an input modulating signal and provides a first modulating signal to a first point inside the loop after the phase-to-digital converter and prior to the loop filter. The second processing unit receives the input modulating signal and provides a second modulating signal to a second point inside the loop after the loop filter.

In one design, the first processing unit includes an accumulator, the second processing unit includes a scaling unit, and the DPLL further includes first and second summers and a divider. The accumulator accumulates the input modulating signal to convert frequency to phase and provides the first modulating signal. The scaling unit scales the input modulating signal with a variable gain to obtain the second modulating signal. The phase-to-digital converter determines the phase difference between a feedback signal and a reference signal and provides a phase difference signal. The first summer sums the phase difference signal and the first modulating signal and provides a phase error signal. The loop filter filters the phase error signal and provides a filtered phase error signal. The second summer sums the filtered phase error signal and the second modulating signal and provides a control signal for an oscillator. The divider divides a modulated signal from the oscillator in frequency and provides the feedback signal. The second processing unit may further include an adaptive delay unit that delays the input modulating signal by a variable delay to match the delays of the lowpass and highpass modulation paths.

Various aspects and features of the disclosure are described in further detail below.

DETAILED DESCRIPTION

The word "exemplary" is used herein to mean "serving as an example, instance, or illustration." Any design described herein as "exemplary" is not necessarily to be construed as preferred or advantageous over other designs.

Figure 1:
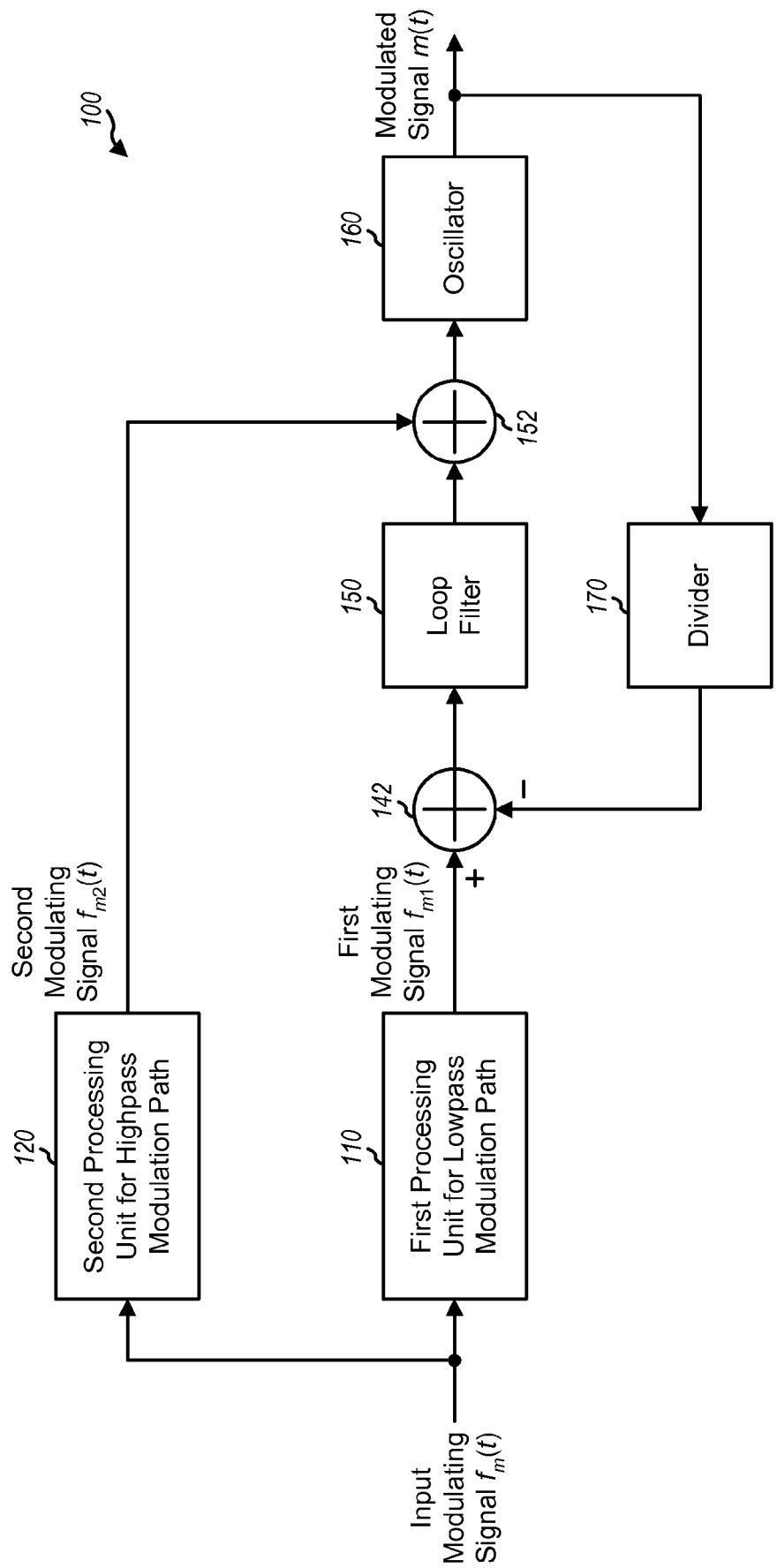
FIG. 1 shows a block diagram of a DPLL with two-point modulation.

FIG. 1 shows a block diagram of a model of a DPLL 100 with two-point modulation. Two-point modulation is also commonly referred to as dual-port modulation. Within DPLL 100, an input modulating signal $f_m(t)$ is provided to both a first processing unit 110 for a lowpass modulation path and a second processing unit 120 for a highpass modulation path. First processing unit 110 accumulates the input modulating signal, possibly delays the input modulating signal by a suitable amount, and provides a first modulating signal $f_{m1}(t)$, which is a modulating phase signal.

Second processing unit 120 scales the input modulating signal with a gain, possibly delays the input modulating signal by a suitable amount, and provides a second modulating signal $f_{m2}(t)$.

A summer 142 subtracts a feedback signal from the first modulating signal and provides a phase error signal. A loop filter 150 filters the phase error signal and provides a filtered phase error signal. Loop filter 150 sets the loop dynamics of DPLL 100 and determines the closed-loop bandwidth, the acquisition time and acquisition range of DPLL 100, the phase noise performance, etc. A summer 152 sums the filtered phase error signal and the second modulating signal and provides a control signal for an oscillator 160. The control signal adjusts the frequency of oscillator 160 such that the phase of the oscillator follows the phase of the modulation. Oscillator 160 provides a modulated signal m(t) having its frequency modulated by the input modulating signal. A divider 170 divides the modulated signal in frequency and provides the feedback signal to summer 142.

As shown in FIG. 1, a modulation point for the lowpass modulation path may be at the input of summer 142, which is prior to loop filter 150. A modulation point for the highpass modulation path may be at the input of summer 152, which is after loop filter 150. The bandwidth of the input modulating signal may be determined by the application for which DPLL 100 is used and may be wider than the closed-loop bandwidth of the DPLL. The bandwidth of the lowpass modulation path is determined by loop filter 150 and may be relatively narrow (e.g., less than 100 KHz) in order to achieve the desired noise filtering and loop dynamics. By applying the input modulating signal via separate highpass and lowpass modulation paths, DPLL 100 can modulate oscillator 160 with a wider signal bandwidth than the closed-loop bandwidth of the DPLL.

Oscillator 160 may be a digitally controlled oscillator (DCO), a voltage controlled oscillator (VCO), a current controlled oscillator (ICO), a numerically controlled oscillator (NCO), or some other type of oscillator whose frequency can be adjusted by a control signal. Oscillator 160 may operate at a nominal frequency of $f_{osc}$, which may be determined by the application for which DPLL 100 is used. For example, DPLL 100 may be used for a wireless communication device, and $f_{osc}$ may be hundreds of megahertz (MHz) or few gigahertz (GHz).

FIG. 1 shows a model of a DPLL with two-point modulation. The DPLL in FIG. 1 may be implemented with various designs.

Figure 2:
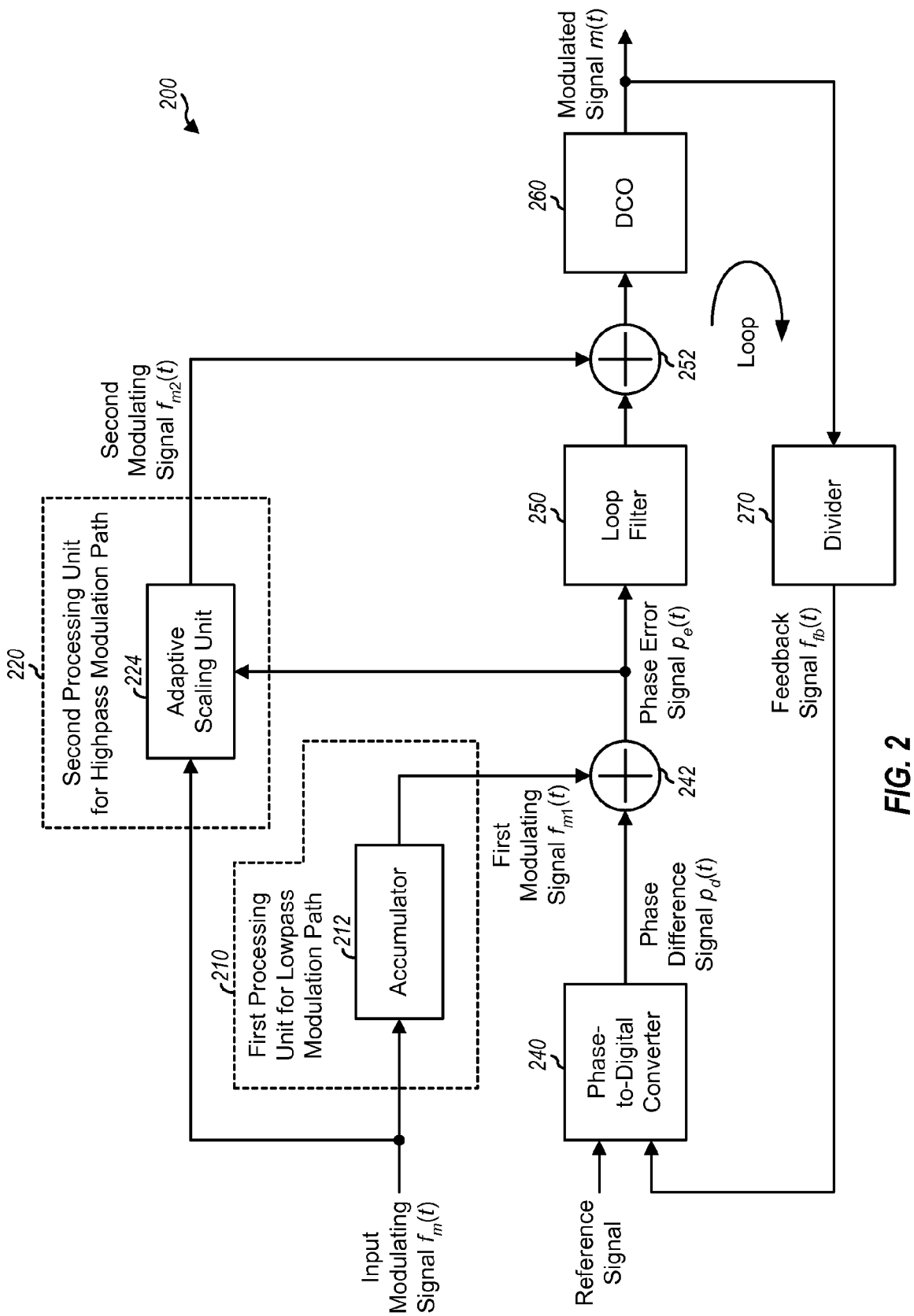
FIGS. 2 and 3 show block diagrams of two designs of a DPLL with two-point modulation using an accumulator and a phase-to-digital converter.

FIG. 2 shows a block diagram of a design of a DPLL 200 with two-point modulation using an accumulator and a phase-to-digital converter (PDC). Within DPLL 200, an input modulating signal $f_m(t)$ is provided to both a first processing unit 210 for a lowpass modulation path and a second processing unit 220 for a highpass modulation path. Within first processing unit 210, an accumulator 212 accumulates the input modulating signal, which converts frequency to phase, and provides a first modulating signal $f_{m1}(t)$, which is a modulating phase signal. Within second processing unit 220, an adaptive scaling unit 224 scales the input modulating signal with a variable gain g(t) and provides a second modulating signal $f_{m2}(t)$, which is a modulating frequency signal.

A phase-to-digital converter 240 compares the phase of a feedback signal $f_{fb}(t)$ against the phase of a reference signal $f_{ref}$ and provides a phase difference signal $p_d(t)$ The reference signal may have a fixed and precise frequency and may also be referred to as a reference clock. A summer 242 sums the phase difference signal and the first modulating signal and provides a phase error signal $p_e(t)$. A loop filter 250 filters the phase error signal and provides a filtered phase error signal. A summer 252 sums the filtered phase error signal and the second modulating signal and provides a control signal for a DCO 260. A multi-modulus divider 270 receives a modulated signal m(t) from DCO 260, divides the modulated signal in frequency by a frequency divider factor, and provides the feedback signal. The frequency divider factor may be determined by the oscillation frequency $f_{osc}$ of DCO 260 and the frequency $f_{ref}$ of the reference signal.

The reference signal may be generated based on a crystal oscillator (XO), a voltage controlled crystal oscillator (VCXO), a temperature compensated crystal oscillator (TCXO), or some other type of oscillator having an accurate frequency. The frequency of the reference signal may be much lower than the frequency of DCO 260. For example, $f_{ref}$ may be tens of MHz whereas $f_{osc}$ may be several GHz.

The performance of two-point modulation is dependent on the proper gain and delay being applied for each modulation path. Adaptive scaling unit 224 can adaptively vary the gain g(t) of the highpass modulation path based on the input modulating signal and the phase error signal to match the gain of the lowpass modulation path, as described below. An adaptive delay unit may be included in one modulation path—typically in the modulation path with the shorter delay. The adaptive delay unit may vary the delay of its modulation path to match the delay of the other modulation path.

Figure 3:
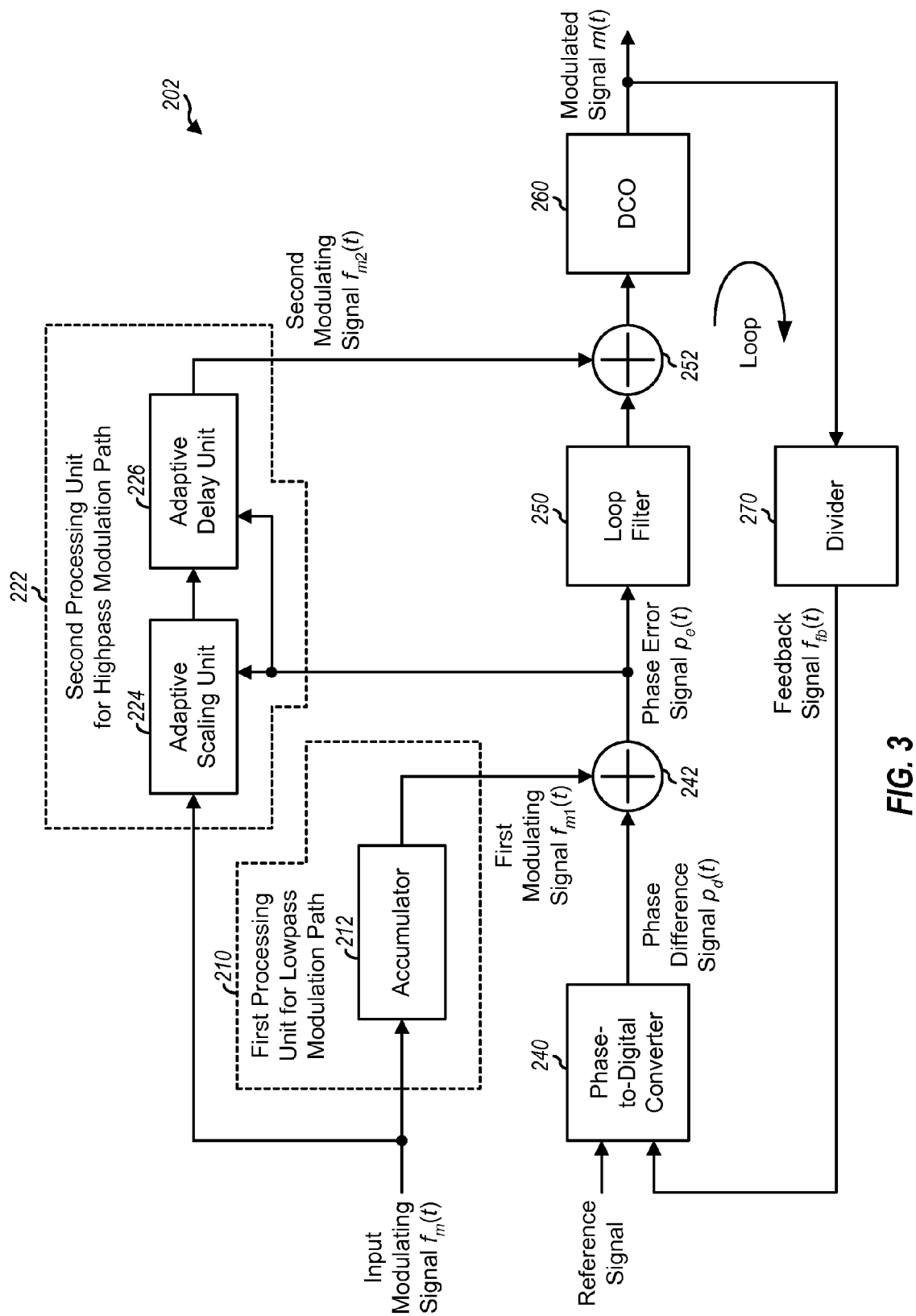

FIG. 3 shows a block diagram of a design of a DPLL 202 with two-point modulation using an accumulator and a phase-to-digital converter and having adaptive delay matching. DPLL 202 includes all circuit blocks in DPLL 200 in FIG. 2, with the exception of second processing unit 220 for the highpass modulation path in FIG. 2 being replaced with a second processing unit 222 in FIG. 3. Within second processing unit 222, adaptive scaling unit 224 scales the input modulating signal with a variable gain g(t) and provides a scaled modulating signal. An adaptive delay unit 226 delays the scaled modulating signal by a variable delay τ(t) and provides the second modulating signal $f_{m2}(t)$ Adaptive scaling unit 224 may adaptively vary the gain g(t) of the highpass modulation path based on the input modulating signal and the phase error signal, as described below. Adaptive delay unit 226 may adaptively vary the delay τ(t) of the highpass modulation path based on the scaled modulating signal and the phase error signal, as also described below. Adaptive delay unit 226 may be placed after adaptive scaling unit 224 (as shown in FIG. 3) or prior to adaptive scaling unit 224 (not shown in FIG. 3). In the design shown in FIG. 3, adaptive delay unit 226 is used in the highpass modulation path. In another design, adaptive delay unit 226 may be omitted, and an adaptive delay unit may be included in first processing unit 210 for the lowpass modulation path (e.g., inserted after accumulator 212).

In the design shown in FIG. 3, gain and delay matching for the highpass and lowpass modulation paths may be achieved by adaptive scaling unit 224 and adaptive delay unit 226, respectively. The gain and delay matching may allow the effects of the two-point modulation via the highpass and lowpass modulation paths to be canceled at the input of loop filter 250, once DPLL 202 is locked. DPLL 202 may then operate as if the lowpass and highpass modulation are not applied.

FIGS. 2 and 3 show two exemplary designs of a DPLL with two-point modulation using an accumulator and a phase-to-digital converter. In the DPLL designs shown in FIGS. 2 and 3, the lowpass modulation path is added in a feed-forward path within the loop. This may provide certain advantages. In particular, disturbance to the feedback path (from DCO 260, through divider 270, to phase-to-digital converter 240) may be avoided by adding the lowpass modulation path in the feed-forward path after the phase-to-digital converter. The use of phase-to-digital converter 240 (instead of a time-to-digital converter) may result in gain errors in phase-to-digital converter 240.

Without two-point modulation, the gain of phase-to-digital converter 240 becomes part of the loop gain, and calibration is not needed for PLL loop operation. With two-point modulation, calibration of the gain of phase-to-digital converter 240 may be performed since the relative gain between the first and second modulating signals will be affected by the gain.

A DPLL with two-point modulation may also be implemented with other designs. For example, a DPLL with two-point modulation may include a time-to-digital converter (TDC) that receives an output signal from a divider and provides a feedback signal. The lowpass modulation path may then be added (i) via a delta-sigma modulator to the divider outside of the loop or (ii) via an accumulator to a summer after the time-to-digital converter. In both cases, the use of the time-to-digital converter in the DPLL may provide certain disadvantages. In particular, gain errors in the time-to-digital converter may result in spurs in the modulated signal. Accurate gain calibration (e.g., to achieve 1% gain accuracy) may be needed for the time-to-digital converter in order to reduce spurs and phase noise. This high gain accuracy may be difficult to achieve. The DPLL designs in FIGS. 2 and 3 may thus be advantageous over the DPLL using the time-to-digital converter.

DPLLs 200 and 202 in FIGS. 2 and 3 may be implemented with all or mostly digital circuits. For example, all circuit blocks in FIGS. 2 and 3, possibly except for DCO 260, may be implemented with digital circuits. All digital circuit blocks, possibly except for divider 270, may operate based on a sample clock at a suitable frequency of $f_{samp}$. A signal provided to or by a digital circuit block may thus be composed of a sequence of samples at the sample rate of $f_{samp}$. The digital circuit blocks may be designed to have sufficient bit width and resolution.

Figure 4:
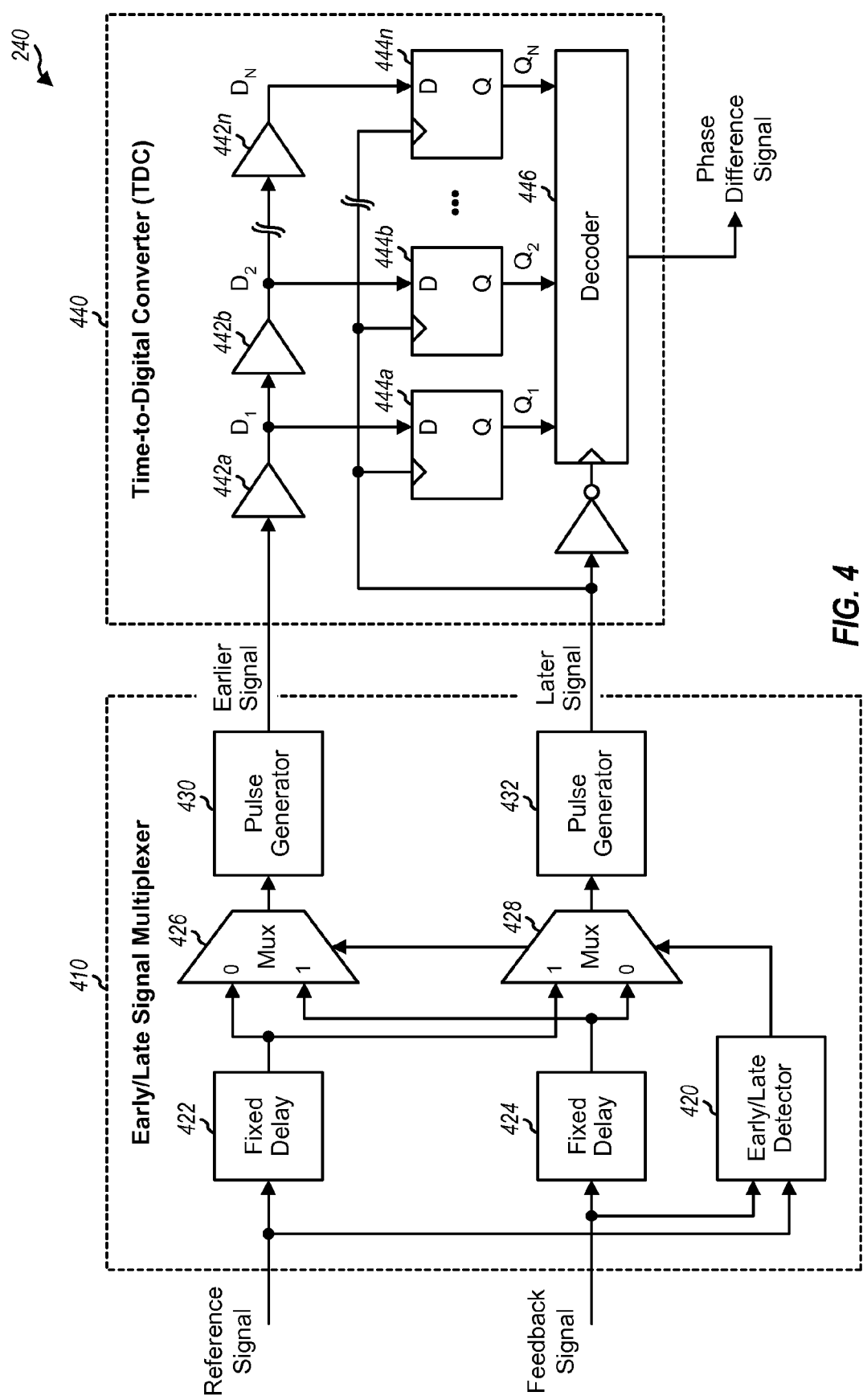
FIG. 4 shows a block diagram of the phase-to-digital converter.

FIG. 4 shows a block diagram of a design of phase-to-digital converter 240 in FIGS. 2 and 3. Phase-to-digital converter 240 includes an early/late signal multiplexer 410 and a time-to-digital converter 440. Signal multiplexer 410 receives the reference signal and the feedback signal, provides one signal as an earlier signal, and provides the other signal as a later signal. Time-to-digital converter 440 determines the phase difference between the earlier signal and the later signal, quantizes the phase difference, and provides the phase difference signal.

Within signal multiplexer 410, a delay unit 422 delays the reference signal by a fixed delay and provides a delayed reference signal. A delay unit 424 delays the feedback signal by the same fixed delay and provides a delayed feedback signal. An early/late detector 420 determines whether the reference signal is earlier than the feedback signal, or vice versa. Detector 420 provides an early/late control signal that is set to '0' if the reference signal is earlier than the feedback signal or to '1' if the reference signal is later than the feedback signal. A multiplexer 426 receives the delayed reference signal and the delayed feedback signal at two inputs and provides one of the signals as a first multiplexer output signal based on the early/late control signal.

A multiplexer 428 also receives the delayed reference signal and the delayed feedback signal at two inputs and provides one of the signals as a second multiplexer output signal based on the early/late control signal. A pulse generator 430 receives the first multiplexer output signal and generates the earlier signal having a pulse for each leading edge in the first multiplexer output signal. Similarly, a pulse generator 432 receives the second multiplexer output signal and generates the later signal having a pulse for each leading edge in the second multiplexer output signal.

Time-to-digital converter 440 includes N delay elements 442a through 442n, N D flip-flops 444a through 444n, and a decoder 446, where $N=2^B$ and B is the number of bits for the quantized phase error. Delay elements 442a through 442n are coupled in series, with the first delay element 442a receiving the earlier signal. Each delay element 442 provides a delay of $T_{unit}$ and may be implemented with inverters and/or other types of logic elements to obtain the desired delay resolution. Delay elements 442a through 442n may provide a total delay of approximately one cycle of the reference signal. Flip-flops 444a through 444n have their D inputs coupled to the outputs of delay elements 442a through 442n, respectively, and their clock inputs receiving the later signal. Each flip-flop 444 samples the output of an associated delay element 442 and provides the sampled output to decoder 446. The number of flip-flops at logic high versus the number of flip-flops at logic low is indicative of the phase difference between the reference signal and the feedback signal. This phase difference may have a resolution of $T_{unit}/2$. An inverter 448 receives the later signal and provides a latch signal to decoder 446. Decoder 446 receives the N outputs from flip-flops 444a through 444n, converts these N outputs to a B-bit binary value when triggered by the latch signal, and provides the B-bit binary value for the phase difference signal.

In general, phase-to-digital converter 240 may be designed with any number of bits of resolution. For example, B may be equal to 8 or more depending on various factors such as the desired delay resolution, the minimum delay available with a given integrated circuit (IC) process, etc. The desired delay resolution may be dependent on the application for which a DPLL is used, the reference signal frequency, etc.

For a DPLL with two-point modulation, adaptive gain scaling may be performed to match the gains of the two modulation paths. For adaptive gain scaling, the gain of the highpass modulation path may be adaptively adjusted to account for any gain difference between the two modulation paths. The adaptive gain adjustment may be based on various adaptive algorithms such as a least mean square (LMS) algorithm, a least square (LS) algorithm, a minimum mean square error (MMSE) algorithm, etc.

These various adaptive algorithms are described by Simon Haykin in a book entitled "Adaptive Filter Theory," 3rd edition, Prentice Hall, 1996. For clarity, adaptive gain scaling based on the LMS algorithm is described below.

The gain g(t) for the highpass modulation path may be adaptively determined based on the input modulating signal $f_m(t)$ and the phase error signal $p_e(t)$ in accordance with the LMS algorithm, as follows:

$$\begin{aligned} g(t) &= g(t-1) + \Delta g(t) \\ &= g(t-1) + \gamma \cdot f_m(t) \cdot p_e(t) \end{aligned} \qquad \text{Eq (1)}$$

where γ is an adaptation step size,
$\Delta g(t)$ is a gain update value for sample period t, and
g(t) is the gain for sample period t.

The adaptation step size γ determines the rate of convergence of the gain to a final value. A larger adaptation step size may result in faster convergence of the gain g(t) to its final value but may also result in more jitter. Conversely, a smaller adaptation step size may result in slower convergence but less jitter. A suitable adaptation step size may be selected based on a tradeoff between convergence rate and jitter. The adaptation step size may also be varied. For example, a larger adaptation step size may be used for acquisition, and a smaller adaptation step size may be used for tracking after convergence.

Figure 5:
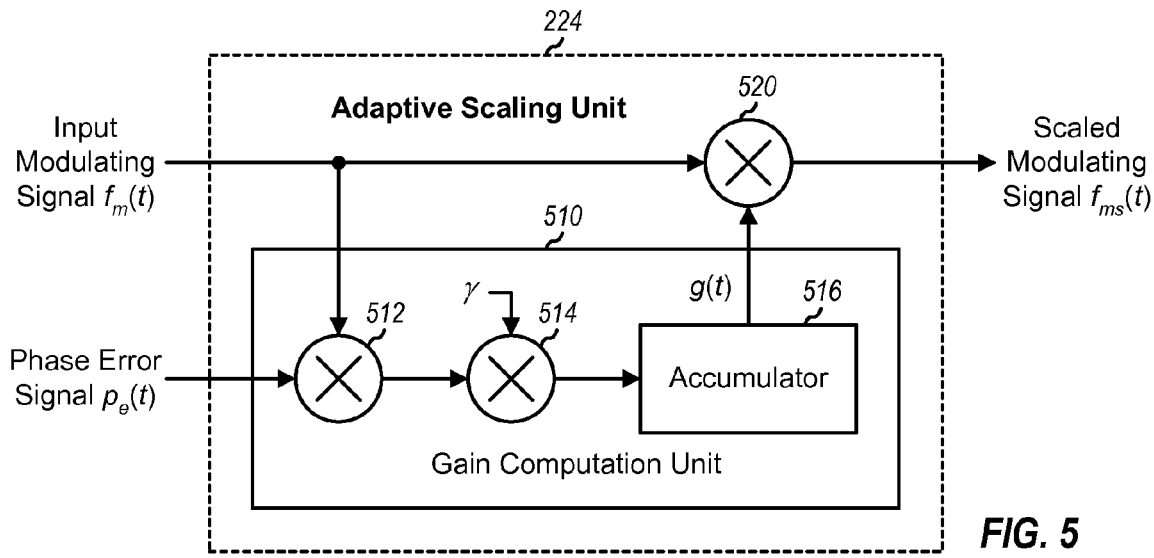
FIG. 5 shows a block diagram of an adaptive scaling unit.

FIG. 5 shows a block diagram of a design of adaptive scaling unit 224 in FIGS. 2 and 3. Adaptive scaling unit 224 includes a gain computation unit 510 and a multiplier 520. Within gain computation unit 510, a multiplier 512 multiplies the input modulating signal with the phase error signal. A multiplier 514 scales the output of multiplier 512 with the adaptation step size γ. An accumulator 516 accumulates the output of multiplier 514 and provides the gain g(t). Multiplier 520 multiplies the input modulating signal with the gain and provides the second modulating signal in FIG. 2 or the scaled modulating signal in FIG. 3.

For a DPLL with two-point modulation, adaptive delay matching may be performed to match the delays of the two modulation paths. For adaptive delay matching, the delay of one modulation path (e.g., the highpass modulation path in the design shown in FIG. 3) may be adaptively adjusted to account for any delay difference between the two modulation paths (e.g., due to fluctuations in the delay of DCO 260).

The adaptive delay adjustment may be based on various adaptive algorithms such as an LMS algorithm, an LS algorithm, an MMSE algorithm, etc. For clarity, adaptive delay adjustment based on the LMS algorithm is described below.

The delay $\tau(t)$ for the highpass modulation path may be adaptively determined based on the scaled modulating signal $f_{ms}(t)$ and the phase error signal $p_e(t)$ in accordance with the LMS algorithm, as follows:

$$\begin{aligned} \tau(t) &= \tau(t-1) + \Delta\tau(t) \\ &= \tau(t-1) + \mu \cdot f_{ms}(t) \cdot p_e(t) \end{aligned} \quad \text{Eq (2)}$$

where $\mu$ is an adaptation step size,
$\Delta\tau(t)$ is a delay update value for sample period t, and
$\tau(t)$ is the delay for sample period t.

A larger adaptation step size may result in faster convergence of the delay $\tau(t)$ whereas a smaller adaptation step size may result in less jitter. A suitable adaptation step size may be selected based on a tradeoff between convergence rate and jitter. The adaptation step size may also be varied, e.g., for acquisition and tracking.

To avoid multiplication in computing the delay update value $\Delta\tau(t)$ in equation (2), the delay may be adaptively updated as follows:

$$\tau(t) = \tau(t-1) + \mu \cdot \text{sign}[f_{ms}(t)] \cdot p_e(t), \quad \text{Eq (3)}$$

where sign $[f_{ms}(t)]$ is the sign of the scaled modulating signal. The adaptation step size $\mu$ may be selected to be a power of two. In this case, the delay update value may be obtained by (i) bit shifting $p_e(t)$ by a specific number of bits determined by the adaptation step size and (ii) flipping the sign of the bit-shifted $p_e(t)$ if $f_{ms}(t)$ is less than zero.

The delay $\tau(t)$ may be given in units of sample periods and may be decomposed into an integer portion and a fractional portion. The integer portion of $\tau(t)$ may be obtained with a programmable delay unit that can provide an integer number of sample periods of delay. The factional portion of $\tau(t)$ may be obtained with an interpolator that can provide a delay that is a fraction of one sample period.

For any given delay $\tau$, where $\tau$ may be a positive or negative value, the scaled modulating signal $f_{ms}(t)$ may be delayed by $\tau$ to obtain the second modulating signal $f_{m2}(t) = f_{ms}(t-\tau)$. The integer portion of $\tau$ may be obtained by selecting a sample in the scaled modulating signal that is closest to $f_{ms}(t-\tau)$. The fractional portion of $\tau$ may be obtained by interpolating two or more samples located on both sides of $f_{ms}(t-\tau)$.

In one design, linear interpolation may be used to obtain a fractional delay. For simplicity, the following description assumes that $-1 \leq \tau(t) \leq 1$ and that three frequency modulation samples $f(t-1)$, $f(t)$ and $f(t+1)$ are available, with $f(t)$ being the current sample, $f(t-1)$ being the prior/older sample, and $f(t+1)$ being the next/future sample. These three samples may be obtained by delaying the scaled modulating signal and using the latest sample of the delayed signal as $f(t+1)$.

Linear interpolation to obtain a fractional delay may be performed as follows:

$$f_{m2}(t) = \begin{cases} [1-\tau(t)] \cdot f(t) + \tau(t) \cdot f(t-1) & \text{for } 0 \leq \tau(t) \leq 1 \\ [1+\tau(t)] \cdot f(t) - \tau(t) \cdot f(t+1) & \text{for } -1 \leq \tau(t) < 0. \end{cases} \quad \text{Eq (4)}$$

The design in equation (4) uses two multiplications—one multiplication with $\tau(t)$ and another multiplication with $[1-\tau(t)]$. The number of multiplications may be reduced to one by rearranging the terms in equation (4), as follows:

$$f_{m2}(t) = \begin{cases} f(t) + \tau(t) \cdot [f(t-1) - f(t)] & \text{for } 0 \leq \tau(t) \leq 1 \\ f(t) - \tau(t) \cdot [f(t+1) - f(t)] & \text{for } -1 \leq \tau(t) < 0. \end{cases} \quad \text{Eq (5)}$$

Equation (5) is equivalent to equation (4). However, only one multiplication with $\tau(t)$ is used to compute $f_{m2}(t)$.

Equations (4) and (5) use linear interpolation to obtain a fractional delay. A fractional delay may also be obtained with higher-order interpolation, e.g., quadratic interpolation, spline interpolation, etc.

Figure 6:
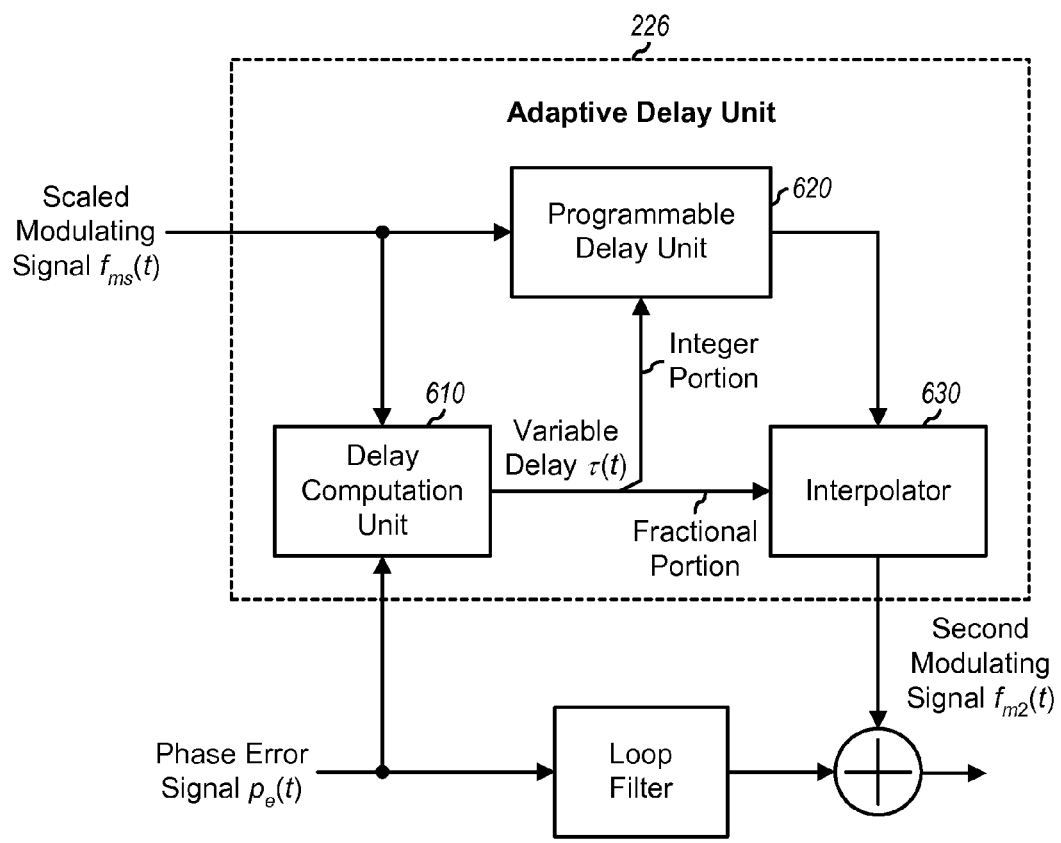
FIG. 6 shows a block diagram of an adaptive delay unit.

FIG. 6 shows a block diagram of a design of adaptive delay unit 226 in FIG. 3. Within adaptive delay unit 226, a delay computation unit 610 receives the scaled modulating signal $f_{ms}(t)$ and the phase error signal $p_e(t)$ and computes the delay $\tau(t)$ for each sample period, e.g., as shown in equation (2) or (3). A programmable delay unit 620 receives the scaled modulating signal and the integer portion of the delay from unit 610 and delays the scaled modulating signal by an integer number of sample periods. An interpolator 630 receives an output signal from programmable delay unit 620 and the fractional portion of the delay from unit 610. Interpolator 630 performs interpolation to obtain the fraction delay, e.g., as shown in equation (4) or (5), and provides the second modulating signal $f_{m2}(t)$.

In general, an apparatus (e.g., an integrated circuit, a wireless communication device, etc.) may include a DPLL that can perform two-point modulation. The DPLL may include a phase-to-digital converter and a loop filter operating in a loop, a first processing unit for a lowpass modulation path, and a second processing unit for a highpass modulation path. The first processing unit may receive an input modulating signal and provide a first modulating signal to a first point inside the loop after the phase-to-digital converter and prior to the loop filter. The second processing unit may receive the input modulating signal and provide a second modulating signal to a second point inside the loop after the loop filter. The phase-to-digital converter may determine a phase difference between a feedback signal in the loop and a reference signal and may provide a phase difference signal. The loop filter may filter a phase error signal obtained based on the phase difference signal and provide a filtered phase error signal. The DPLL may include other circuit blocks.

In one design, the first processing unit may include an accumulator that accumulates the input modulating signal to convert frequency to phase and provides the first modulating signal.

In one design, the second processing unit may include an adaptive scaling unit that scales the input modulating signal with a variable gain. In one design, the adaptive scaling unit may include a gain computation unit and a multiplier, e.g., as shown in FIG. 5. The gain computation unit may determine the variable gain based on the input modulating signal and a phase error signal provided to the loop filter. The multiplier may multiply the input modulating signal with the variable gain.

The second processing unit may further include an adaptive delay unit that delays the input modulating signal by a variable delay. In one design, the adaptive delay unit may include a delay computation unit, an interpolator, and a programmable delay unit. The delay computation unit may determine the variable delay based on the input modulating signal and the phase error signal. The interpolator may provide a fractional portion of the variable delay for the input modulating signal, with the fractional portion being between +1 and -1 sample period. The programmable delay unit may provide an integer portion of the variable delay for the input modulating signal, with the integer portion comprising an integer number of sample periods.

In one design, a processor may perform two-point modulation via a lowpass modulation path and a highpass modulation path of a DPLL comprising a phase-to-digital converter and a loop filter operating in a loop. The processor may process an input modulating signal for the lowpass modulation path to obtain a first modulating signal and may apply the first modulating signal to a first point inside the loop after the phase-to-digital converter and prior to the loop filter. The processor may also process the input modulating signal for the highpass modulation path to obtain a second modulating signal and may apply the second modulating signal to a second point inside the loop after the loop filter. The processor may process the input modulating signal for the lowpass modulation path by accumulating the input modulating signal to convert frequency to phase. The processor may process the input modulating signal for the highpass modulation path by scaling the input modulating signal with a variable gain and possibly by delaying the input modulating signal with a variable delay.

In one design, a DPLL may include an accumulator, a scaling unit, a phase-to-digital converter, first and second summers, a loop filter, and a divider, e.g., as shown in FIGS. 2 and 3. The accumulator may accumulate an input modulating signal to convert frequency to phase and provide a first modulating signal. The scaling unit may scale the input modulating signal with a variable gain to obtain a second modulating signal. The phase-to-digital converter may determine the phase difference between a feedback signal and a reference signal and provide a phase difference signal. The first summer may sum the phase difference signal and the first modulating signal and provide a phase error signal. The loop filter may filter the phase error signal and provide a filtered phase error signal. The second summer may sum the filtered phase error signal and the second modulating signal and provide a control signal for an oscillator. The divider may divide a modulated signal from the oscillator in frequency and provide the feedback signal. The DPLL may further include an adaptive delay unit that may delay the input modulating signal by a variable delay, e.g., as shown in FIG. 3.

Figure 7:
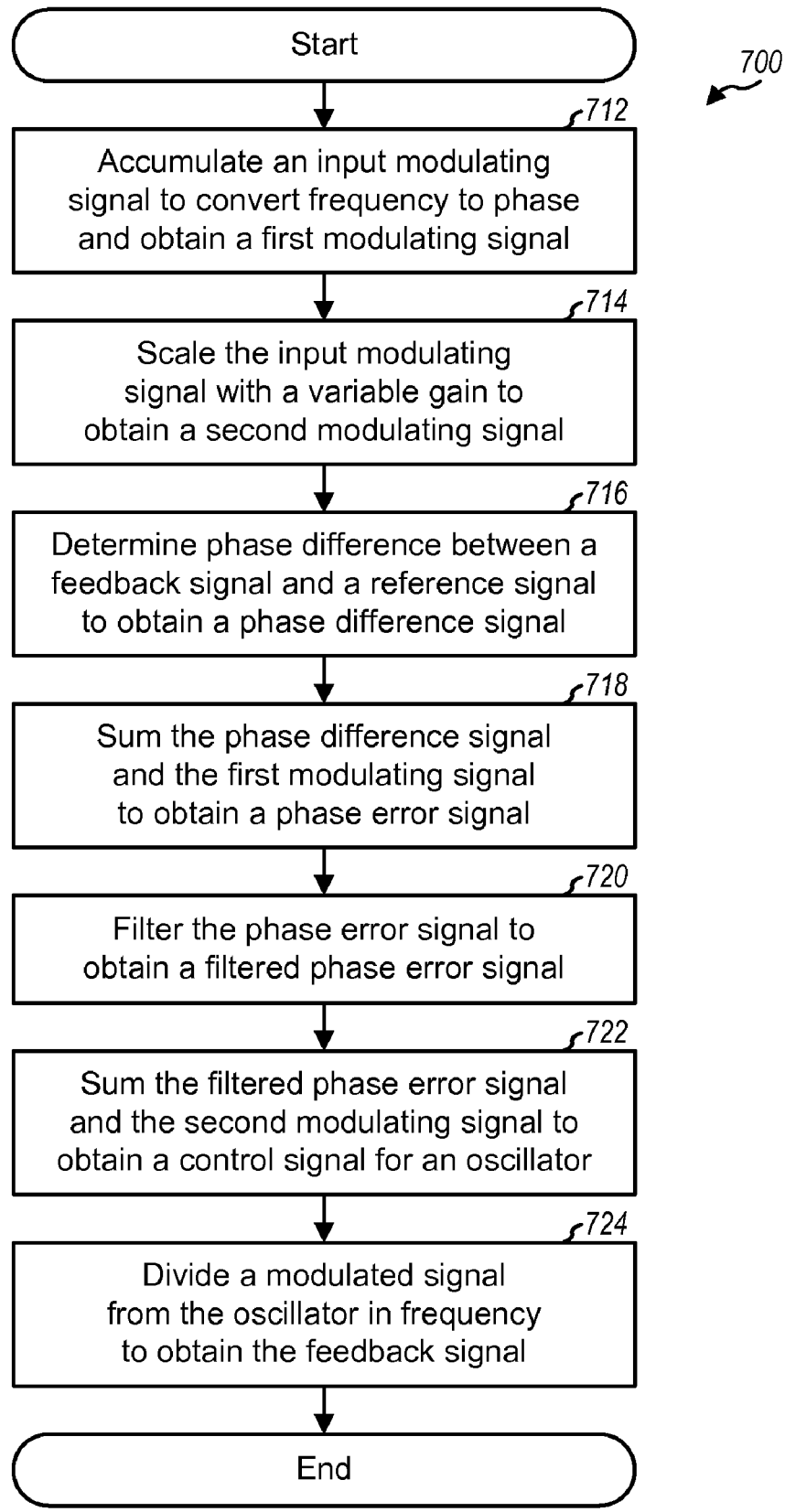
FIG. 7 shows a process for operating a DPLL for two-point modulation.

FIG. 7 shows a design of a process 700 for operating a DPLL for two-point modulation. An input modulating signal may be accumulated to convert frequency to phase and obtain a first modulating signal (block 712). The input modulating signal may be scaled with a variable gain and may be further delayed with a variable delay to obtain a second modulating signal (block 714). The variable gain and the variable delay may each be determined based on the input modulating signal and the phase error signal, e.g., as shown in equations (1), (2) and (3). The phase difference between a feedback signal and a reference signal may be determined to obtain a phase difference signal (block 716). The phase difference signal and the first modulating signal may be summed to obtain a phase error signal (block 718). The phase error signal may be filtered to obtain a filtered phase error signal (block 720). The filtered phase error signal and the second modulating signal may be summed to obtain a control signal for an oscillator (block 722). A modulated signal from the oscillator may be divided in frequency to obtain the feedback signal (block 724).

The DPLL described herein may be used for various applications such as communication, computing, networking, personal electronics, etc. For example, the DPLL may be used in wireless communication devices, cellular phones, personal digital assistants (PDAs), handheld devices, gaming devices, computing devices, laptop computers, consumer electronics devices, personal computers, cordless phones, a wireless local loop (WLL) station, etc. An exemplary use of the DPLL in a wireless communication device is described below.

Figure 8:
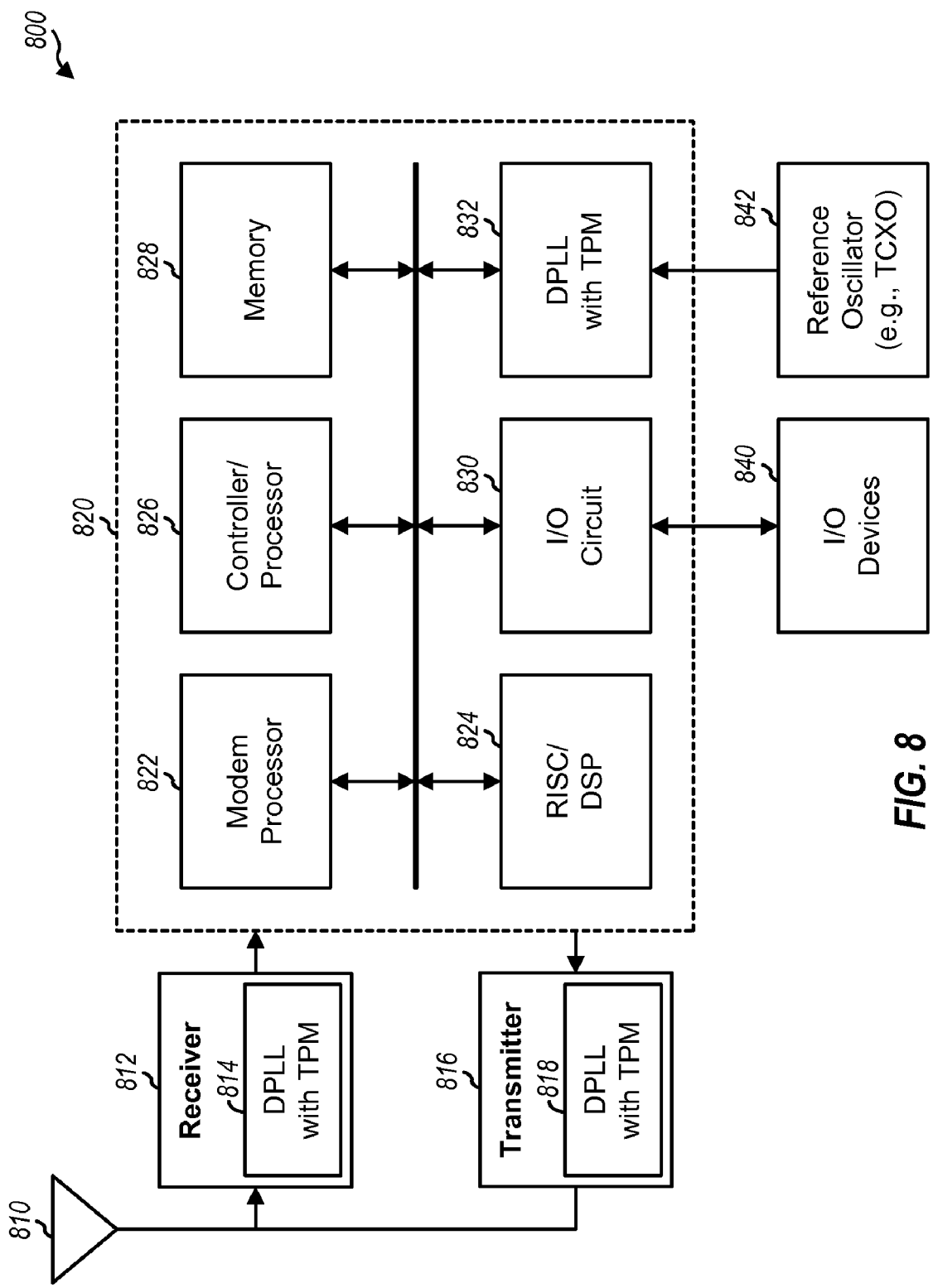
FIG. 8 shows a block diagram of a wireless communication device.

FIG. 8 shows a block diagram of a design of a wireless communication device 800 for a wireless communication system. Wireless device 800 may be a cellular phone, a terminal, a handset, a wireless modem, etc. The wireless communication system may be a Code Division Multiple Access (CDMA) system, a Global System for Mobile Communications (GSM) system, an Orthogonal Frequency Division Multiple Access (OFDMA) system, etc.

Wireless device 800 is capable of providing bi-directional communication via a receive path and a transmit path. In the receive path, signals transmitted by base stations (not shown) are received by an antenna 810 and provided to a receiver 812. Receiver 812 conditions and digitizes the received signal and provides samples to a module 820 for further processing. In the transmit path, a transmitter 816 receives data to be transmitted from module 820, processes and conditions the data, and generates a modulated signal, which is transmitted via antenna 810 to the base stations. Receiver 812 and transmitter 816 may support CDMA, GSM, OFDMA, etc.

Module 820 includes various processing, interface, and memory units such as, for example, a modem processor 822, a reduced instruction set computer/digital signal processor (RISC/DSP) 824, a controller/processor 826, a memory 828, an input/output (I/O) circuit 830, and a DPLL 832. Modem processor 822 may perform processing for data transmission and reception, e.g., encoding, modulation, demodulation, decoding, etc. RISC/DSP 824 may perform general and specialized processing for wireless device 800. Controller/processor 826 may direct the operation of various units within module 820. Memory 828 may store data and/or instructions for various units within module 820. I/O circuit 830 may communicate with external I/O devices 840. DPLL 832 may generate clocks for the processing units within module 820.

A DPLL 814 may generate a receive local oscillator (LO) signal used by receiver 812 for frequency downconversion and/or demodulation. A DPLL 818 may generate a transmit LO signal used by transmitter 816 for frequency upconversion and/or modulation. DPLL 814 and/or 818 may be implemented with DPLL 200 in FIG. 2, DPLL 202 in FIG. 3, or some other DPLL with two-point modulation (TPM). A reference oscillator 842 may generate an accurate reference signal for DPLL 814, 818 and/or 832. Reference oscillator 842 may be an XO, a VCXO, a TCXO, etc.

The DPLL described herein may be implemented on an IC, an analog IC, a radio frequency IC (RFIC), a mixed-signal IC, an application specific integrated circuit (ASIC), a printed circuit board (PCB), an electronics device, etc. The DPLL may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), etc.

An apparatus implementing the DPLL described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus comprising:
  a digital phase-locked loop (DPLL) comprising;
    a phase-to-digital converter and a loop filter operating in a loop;
    a first processing unit for a lowpass modulation path and operative to receive an input modulating signal and provide a first modulating signal to a first point inside the loop after the phase-to-digital converter and prior to the loop filter; and
    a second processing unit for a highpass modulation path and operative to receive the input modulating signal and provide a second modulating signal to a second point inside the loop after the loop filter comprising:
      an adaptive scaling unit operative to scale the input modulating signal with a variable gain comprising:
        a gain computation unit operative to determine the variable gain based on the input modulating signal and a phase error signal provided to the loop filter; and
        a multiplier operative to multiply the input modulating signal with the variable gain.

2. The apparatus of claim 1, wherein the first processing unit comprises:
  an accumulator operative to accumulate the input modulating signal to convert frequency to phase and provide the first modulating signal.

3. The apparatus of claim 1, wherein the second processing unit further comprises:
  an adaptive delay unit operative to delay the input modulating signal by a variable delay.

4. The apparatus of claim 3, wherein the adaptive delay unit comprises:
  a delay computation unit operative to determine the variable delay based on the input modulating signal and a phase error signal provided to the loop filter; and
  an interpolator operative to provide a fractional portion of the variable delay for the input modulating signal, the fractional portion being between minus one sample period and plus one sample period.

5. The apparatus of claim 4, wherein the adaptive delay unit further comprises:
  a programmable delay unit operative to provide an integer portion of the variable delay for the input modulating signal, the integer portion comprising an integer number of sample periods.

6. The apparatus of claim 1, wherein the phase-to-digital converter is operative to determine a phase difference between a feedback signal in the loop and a reference signal and provide a phase difference signal, and wherein the loop filter is operative to filter a phase error signal obtained based on the phase difference signal and provide a filtered phase error signal.

7. The apparatus of claim 6, wherein the DPLL further comprises:
  a first summer operative to sum the phase difference signal and the first modulating signal and provide the phase error signal,
  a second summer operative to sum the filtered phase error signal and the second modulating signal and provide a control signal for an oscillator; and
  a divider operative to divide a modulated signal from the oscillator in frequency and provide the feedback signal.

8. The apparatus of claim 6, wherein the phase-to-digital converter comprises:
  a signal multiplexer operative to receive the reference signal and the feedback signal, to provide the earlier of the reference signal and the feedback signal as an earlier signal, and to provide the later of the reference signal and the feedback signal as a later signal; and
  a time-to-digital converter operative to determine a phase difference between the earlier signal and the later signal and provide the phase difference signal.

9. The apparatus of claim 1, wherein the apparatus is an integrated circuit.

10. The apparatus of claim 1, wherein the apparatus is a wireless communication device.

11. An apparatus comprising:
  a processor operative to perform two-point modulation via a lowpass modulation path and a highpass modulation path of a digital phase-locked loop (DPLL) comprising:
    a phase-to-digital converter and a loop filter operating in a loop, to process an input modulating signal for the lowpass modulation path to obtain a first modulating signal, to apply the first modulating signal to a first point inside the loop after the phase-to-digital converter and prior to the loop filter, to process the input modulating signal for the highpass modulation path to obtain a second modulating signal, and to apply the second modulating signal to a second point inside the loop after the loop filter,
    wherein the processor is configured to process the input modulating signal for the lowpass modulation path by accumulating the input modulating signal to convert frequency to phase, and to process the input modulating signal for the highpass modulation path by scaling the input modulating signal with a variable gain, wherein the variable gain is determined based on the input modulating signal and a phase error signal provided to the loop filter.

12. An apparatus comprising:
a digital phase-locked loop (DPLL) comprising
an accumulator operative to accumulate an input modulating signal to convert frequency to phase to obtain a first modulating signal;
a scaling unit operative to scale the input modulating signal with a variable gain to obtain a second modulating signal, the scaling unit comprising:
    a gain computation unit operative to determine the variable gain based on the input modulating signal and a phase error signal provided to the loop filter; and
    a multiplier operative to multiply the input modulating signal with the variable gain;
a phase-to-digital converter operative to determine a phase difference between a feedback signal and a reference signal and provide a phase difference signal;
a first summer operative to sum the phase difference signal and the first modulating signal and provide a phase error signal;
a loop filter operative to filter the phase error signal and provide a filtered phase error signal; and
a second summer operative to sum the filtered phase error signal and the second modulating signal and provide a control signal for an oscillator.

13. The apparatus of claim 12, wherein the DPLL further comprises:
a divider operative to divide a modulated signal from the oscillator in frequency and provide the feedback signal.

14. The apparatus of claim 12, wherein the DPLL further comprises:
an adaptive delay unit operative to delay the input modulating signal by a variable delay.

15. A method of operating a digital phase-locked loop (DPLL) comprising:
accumulating an input modulating signal to convert frequency to phase and obtain a first modulating signal;
determining a variable gain based on the input modulating signal and a phase error signal provided to a loop filter;
multiplying the input modulating signal with the variable gain to scale the input modulating signal and obtain a second modulating signal;
determining a phase difference between a feedback signal and a reference signal to obtain a phase difference signal;
summing the phase difference signal and the first modulating signal to obtain a phase error signal;
filtering the phase error signal to obtain a filtered phase error signal; and
summing the filtered phase error signal and the second modulating signal to obtain a control signal for an oscillator.

16. The method of claim 15, further comprising:
dividing a modulated signal from the oscillator in frequency to obtain the feedback signal.

17. The method of claim 15, further comprising:
delaying the input modulating signal by a variable delay to obtain the second modulating signal.

18. The method of claim 17, further comprising:
determining the variable delay based on the input modulating signal and the phase error signal.

19. The method of claim 15, further comprising:
determining the variable gain based on the input modulating signal and the phase error signal.

20. An apparatus comprising:
means for accumulating an input modulating signal to convert frequency to phase and obtain a first modulating signal;
means for determining a variable gain based on the input modulating signal and a phase error signal provided to a loop filter;
means for multiplying the input modulating signal with the variable gain to scale the input modulating signal and obtain a second modulating signal;
means for scaling the input modulating signal with a variable gain to obtain a second modulating signal;
means for determining a phase difference between a feedback signal and a reference signal to obtain a phase difference signal;
means for summing the phase difference signal and the first modulating signal to obtain a phase error signal;
means for filtering the phase error signal to obtain a filtered phase error signal; and
means for summing the filtered phase error signal and the second modulating signal to obtain a control signal for an oscillator.

21. The apparatus of claim 20, further comprising:
means for delaying the input modulating signal by a variable delay to obtain the second modulating signal.

22. The apparatus of claim 21, further comprising:
means for determining the variable delay based on the input modulating signal and the phase error signal.

23. The apparatus of claim 20, further comprising:
means for determining the variable gain based on the input modulating signal and the phase error signal.

24. A non-transitory processor-readable storage medium having stored thereon processor executable instructions configured to cause a processor to perform steps, comprising:
accumulating an input modulating signal to convert frequency to phase and obtain a first modulating signal;
determining a variable gain based on the input modulating signal and a phase error signal provided to a loop filter;
multiplying the input modulating signal with the variable gain to scale the input modulating signal and obtain a second modulating signal;
determining a phase difference between a feedback signal and a reference signal to obtain a phase difference signal;
summing the phase difference signal and the first modulating signal to obtain a phase error signal;
filtering the phase error signal to obtain a filtered phase error signal; and
summing the filtered phase error signal and the second modulating signal to obtain a control signal for an oscillator.

25. The non-transitory processor-readable storage medium of claim 24 having stored thereon processor executable instructions to cause the processor to perform steps, further comprising:
delaying the input modulating signal by a variable delay to obtain the second modulating signal.

26. The non-transitory processor-readable storage medium of claim 25 having stored thereon processor executable instructions to cause the processor to perform steps further comprising:
determining the variable delay based on the input modulating signal and the phase error signal.

27. The non-transitory processor-readable storage medium of claim 24 having stored thereon processor executable instructions to cause the processor to perform steps further comprising:
determining the variable gain based on the input modulating signal and the phase error signal.

* * * * *